US007504896B2

(12) United States Patent
Bhushan et al.

(10) Patent No.: US 7,504,896 B2
(45) Date of Patent: Mar. 17, 2009

(54) METHODS AND APPARATUS FOR INLINE MEASUREMENT OF SWITCHING DELAY HISTORY EFFECTS IN PD-SOI TECHNOLOGY

(75) Inventors: Manjul Bhushan, Hopewell Junction, NY (US); Mark B. Ketchen, Hadley, MA (US)

(73) Assignee: International Business Machines Corporation, Armonk, NY (US)

( * ) Notice: Subject to any disclaimer, the term of this patent is extended or adjusted under 35 U.S.C. 154(b) by 72 days.

(21) Appl. No.: 11/516,139

(22) Filed: Sep. 6, 2006

(65) Prior Publication Data

US 2008/0068099 A1    Mar. 20, 2008

(51) Int. Cl.
*H03K 3/03* (2006.01)
*G01R 29/02* (2006.01)
*G01R 23/175* (2006.01)

(52) U.S. Cl. .................. 331/57; 324/76.52; 324/76.54; 324/76.77; 368/118; 702/79

(58) Field of Classification Search .................. 331/57; 324/76.52, 76.54, 76.77; 368/118; 702/79
See application file for complete search history.

(56) References Cited

U.S. PATENT DOCUMENTS

| | | | | |
|---|---|---|---|---|
| 6,134,191 | A * | 10/2000 | Alfke | ......................... 368/118 |
| 6,239,591 | B1 * | 5/2001 | Bryant et al. | ............. 324/158.1 |
| 6,798,261 | B1 | 9/2004 | Bhushan et al. | |
| 6,960,926 | B2 | 11/2005 | Anderson et al. | |

2005/0110581 A1 *  5/2005 Ngo ............................ 331/18

OTHER PUBLICATIONS

M.B. Ketchen et al., "Circuit and Technique for Characterizing Switching Delay History Effects in Silicon-on-Insulator Logic Gates," Review of Scientific Instruments, Mar. 2004, pp. 1-4, vol. 75, No. 3.
M. Ketchen et al., "High Speed Test Structures for In-Line Process Monitoring and Model Calibration," Procedures 2005 IEEE International Conference on Microelectronic Test Structures, Apr. 2005, 6 pages.
M.B. Ketchen et al., "Product-Representative "at speed" Test Structures for CMOS Characterization," IBM Journal of Research and Development, Jul./Sep. 2006, pp. 451-468, vol. 50, No. 4/5.

* cited by examiner

*Primary Examiner*—Robert Pascal
*Assistant Examiner*—Levi Gannon
(74) *Attorney, Agent, or Firm*—Ido Tuchman; Ryan, Mason & Lewis, LLP

(57) ABSTRACT

Techniques for inline measurement of switching delay history effects in an integrated circuit device are provided. A pulse is launched down a delay chain. The pulse is substantially synchronized with a signal of a ring oscillator. The delay chain and the ring oscillator comprise substantially identical gates to a defined point on the ring oscillator corresponding to a far end of the delay chain. At least one difference in a number of gates traversed by an edge of the signal in the ring oscillator and a number of gates traversed by a corresponding edge of the pulse in the delay chain is measured when the pulse reaches the far end of the delay chain. One or more switching histories in the integrated circuit device are determined in accordance with the at least one measured difference in the number of gates traversed by an edge of the signal and a corresponding edge of the pulse.

13 Claims, 11 Drawing Sheets

| STEP | 1 | 2 | 3 | 4 | 5 | 6 | 7 | 8 | 9 | 10 | 11 | 12 | 13 | 14 | 15 | 16 | 17 | 18 | 19 | 20 |
|---|---|---|---|---|---|---|---|---|---|---|---|---|---|---|---|---|---|---|---|---|
| SEL | 1 | 1 | 1 | 1 | 1 | 1 | 1 | 1 | 1 | 1 | 1 | 1 | 1 | 1 | 1 | 1 | 1 | 1 | 1 | 1 |
| ARM | 0 | 0 | 0 | 1 | 1 | 1 | 1 | 1 | 1 | 1 | 1 | 1 | 1 | 0 | 0 | 0 | 0 | 0 | 0 | 0 |
| LAUNCH | 0 | 1 | 0 | 0 | 1 | 0 | 0 | 1 | 0 | 1 | 1 | 0 | 0 | 1 | 0 | 0 | 0 | 0 | 1 | 1 |
| Y1 | 0 | 0 | 0 | 0 | 0 | 0 | 0 | 1 | 1 | 1 | 1 | 0 | 1 | 0 | 0 | 0 | 0 | 0 | 0 | 0 |
| Y2 | 0 | 0 | 0 | 0 | 0 | 0 | 1 | 1 | 1 | 0 | 0 | 0 | 0 | 0 | 1 | 1 | 1 | 1 | 0 | 0 |
| Y3 | 0 | 0 | 0 | 0 | 0 | 0 | 0 | 0 | 0 | 0 | 0 | 0 | 0 | 0 | 0 | 0 | 0 | 1 | 1 | 1 |
| OUT | 0 | 0 | 0 | 0 | 0 | 0 | 0 | 0 | 0 | 0 | 0 | 0 | 0 | 0 | 0 | 0 | 0 | 0 | 1 | 0 |

METHODS AND APPARATUS FOR INLINE MEASUREMENT OF SWITCHING DELAY HISTORY EFFECTS IN PD-SOI TECHNOLOGY

FIELD OF THE INVENTION

The present invention relates generally to integrated circuit devices and, more particularly, to inline techniques for measurement of switching delay history effects in an integrated circuit device.

BACKGROUND OF THE INVENTION

In a complementary metal-oxide semiconductor (CMOS) circuit in partially depleted silicon on insulator (PD-SOI) technology, the delay is dependent on its switching history. When a circuit first switches after sitting idle for a few milliseconds (ms) or more it will have a longer or shorter delay than when it switches again within a few nanoseconds (ns). The first switch of the circuit is referred to herein as 1SW, while the second switch is referred herein as 2SW. If the same circuit is switching on a regular basis, every few ns or less, it will have a third delay characteristic of steady state operation, referred to herein as SS. These effects, known as SOI history, are required to be measured to accurately characterize the performance of PD-SOI circuits.

The measurement of SOI history requires input pulse widths of a few ns and picoseconds (ps) time resolution, see, for example, Ketchen et al., "Circuit and Technique for Characterizing Switching Delay History Effects in Silicon on Insulator Logic Gates," Review of Scientific Instruments, Vol. 75, pp. 768-771, March 2004. Typically, such measurements have been made as bench tests on limited hardware using high speed probing techniques and equipment. These measurements are difficult to perform during processing in a manufacturing environment because of problems with noise, shielding and test time. Bench measurements have shown that the PD-SOI history is often 10-15% in present CMOS technology and it is a strong function of device design. History variation across a wafer may be in excess of 5%.

Recently an approach has been described for measuring SOI history using a self-calibrating, self-timed technique with dc signal inputs and outputs, see, for example, Ketchen et al., "High Speed Test Structures for In-Line Process Monitoring and Model Calibration," Proc. 2005 IEEE International Conference on Microelectronic Test Structures, pp. 33-38, April 2005. History measurements with resolution of 1% are achievable without the use of high frequency equipment. This design has been implemented and is now routinely used in a manufacturing environment to gather data for understanding the effects of process and statistical variations on history. This technique measures only the fractional difference between 1SW and 2SW delays. The question of where SS delay lies with respect to 1SW and 2SW delays is specifically not addressed with this structure, nor are the actual 1SW and 2SW delays themselves measured.

The technology is often evaluated in terms of the performance of one or more ring oscillators (ROs) which give SS delays. At present the offset between SS delays and 1SW and 2SW delays can only be obtained from time-resolved bench test measurements on appropriately designed and stimulated delay chain (DLC) structures. As an example, FIG. 1 is a diagram that illustrates the bench test data for an inverter chain experiment in 130 nanometer (nm) PD-SOI technology. Here the percentage delay differences for 1SW, 2SW and SS switching sequences represented as 1SW-SS, 2SW-SS, and 1SW-2SW histories are all plotted as a function of the power supply voltage VDD, where the nominal operating VDD=1.2V. The 1SW-2SW history peaks at around 1.1 V. It is noteworthy that at low VDD most of the history is associated with 2SW speedup compared to SS while at high VDD most of the history involves slowdown of 1SW with respect to SS. At VDD=1.2 V, SS delay, also measured with a RO, will be about 3.5% more than the average of 1SW and 2SW delays while at VDD=1.8V it will be 3.5% less.

Measuring only the 1SW-2SW history provides considerable insight in the delay variability, but also fails to correlate this history with SS delays. It is thus of considerable interest and value to develop a test structure that allows one to routinely measure as an inline test on a standard parametric tester the 1SW-SS and 2SW-SS histories as well.

SUMMARY OF THE INVENTION

The present invention provides techniques for inline measurement of switching delay history effects with respect to steady state delay in PD-SOI technology.

For example, in one aspect of the invention, a method of inline measurement of switching delay history effects in an integrated circuit device is provided. A pulse is launched down a delay chain. The pulse is substantially synchronized with a signal of a ring oscillator. The delay chain and the ring oscillator comprise substantially identical gates to a defined point on the ring oscillator corresponding to a far end of the delay chain. At least one difference in a number of gates traversed by an edge of the signal in the ring oscillator and a number of gates traversed by a corresponding edge of the pulse in the delay chain is measured when the pulse reaches the far end of the delay chain. One or more switching histories in the integrated circuit device is determined in accordance with the at least one measured difference in the number of gates traversed by an edge of the signal and a corresponding edge of the pulse.

In order to measure at least one difference, a fractional difference in a delay of a rising edge and a falling edge of the signal in the ring oscillator and a delay of a rising edge of the pulse in the delay chain may be determined. Additionally, one or more delays in the integrated circuit device may be determined in accordance with the fractional difference in delay and a frequency of oscillation of the ring oscillator.

In accordance with another aspect of the invention, an integrated circuit device is provided. The integrated circuit device comprises a ring oscillator having a plurality of gates and a period of oscillation, and pulse generation circuitry integrated with the ring oscillator for generation of a pulse substantially synchronized with a signal of the ring oscillator. The integrated circuit device further comprises a delay chain having substantially identical gates to the ring oscillator to a defined point of the ring oscillator corresponding to a far end of the delay chain. The delay chain is electrically connected with the pulse generation circuitry to receive the pulse synchronized with a signal of the ring oscillator. Finally, the integrated circuit device comprises signal delay measurement circuitry electrically connected with the ring oscillator and the delay chain to determine one or more switching in the integrated circuit device in accordance with at least one measured difference in a number of gates traversed by an edge of the signal in the ring oscillator and a number of gates traversed by a corresponding edge of the pulse in the delay chain when the pulse reaches a far end of the delay chain.

These and other objects, features and advantages of the present invention will become apparent from the following

DETAILED DESCRIPTION OF THE PREFERRED EMBODIMENTS

An integrated circuit device is provided for measuring the 1SW-SS, 2SW-SS 1SW-2SW history in CMOS gates fabricated in PD-SOI technology. The embodiments of the present invention perform measurements independent of the relative magnitudes of 1SW, 2SW and SS delays. Such embodiments consist of a ring oscillator (RO), with a period of oscillation of a few ns, a delay chain (DLC), a circuit to launch a pulse down the DLC synchronously with the signal of the RO, and a circuit to measure the position of the rising and falling edges of the pulse with respect to corresponding edges of the signal of the RO. Both the difference in 1SW and 2SW delays with respect to SS delay and the absolute magnitudes of these delays are determined in units of the delay of the inverting CMOS gate utilized in the RO and DLC. The SS gate delay is extracted from the frequency of oscillation of the RO which after dividing down to a few MHz can be easily measured with an off-the-shelf frequency counter, see, for example, Ketchen et al., "High Speed Test Structures for In-line Process Monitoring and Model Calibration," *Proc. 2005 IEEE International Conference on Microelectronic Test Structures*, pp. 33-38, April, 2005. The measured SS gate delay of the RO is then used to determine the absolute magnitudes of the 1SW and 2SW gate delays and 1SW-SS and 2SW-SS delay differences.

The circuit is configured such that it requires only direct current DC inputs and outputs and all the measurements can be made as an inline test on a standard parametric tester. The RO and the DLC both comprise identical inverting gates, and are located in close physical proximity. A pulse of width equal to half the period of oscillation of the RO (a few ns) is launched down the DLC synchronized with a second signal circulating around the RO. The timing of this pulse as it reaches the end of the DLC relative the corresponding pulse traveling around the RO is determined in units of gate delay. The fractional difference between the number of gates in the DLC and the corresponding number of gates traversed by the signal in the RO is a measure of the 1SW-SS history for the leading edge of the pulse and the 2SW-SS history for the trailing edge of the pulse. Since the SS delay of the gate can be directly determined from the frequency of oscillation of the RO, it follows that the 1SW and 2SW delays can also be determined.

Figure 2:
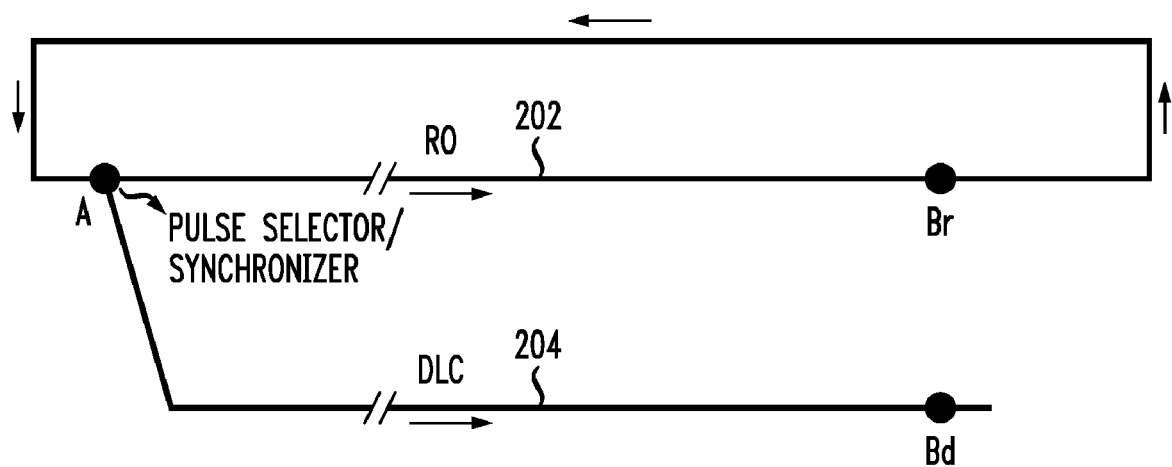
FIG. 2 is a diagram illustrating a RO and a DLC configuration, according to an embodiment of the present invention.

Referring now to FIG. 2, a diagram illustrates a RO and a DLC configuration, according to an embodiment of the present invention. A RO 202 comprises a large number n of identical inverting stages, such as, for example, approximately one thousand stages. In its steady oscillating state, RO 202 has a constant frequency of oscillation $f=1/(2n\tau)$ where $\tau$ is the delay per stage. A DLC 204 comprising the same stages as in RO 202 receives a single pulse of width $1/(2f)$ from RO 202 at point A and this pulse travels to the point Bd at the end of DLC 204. By design the circuit composition and nominal delay from A to node Bd in DLC 204 is the same as that of the path from A to Br in RO 202.

Figure 3:
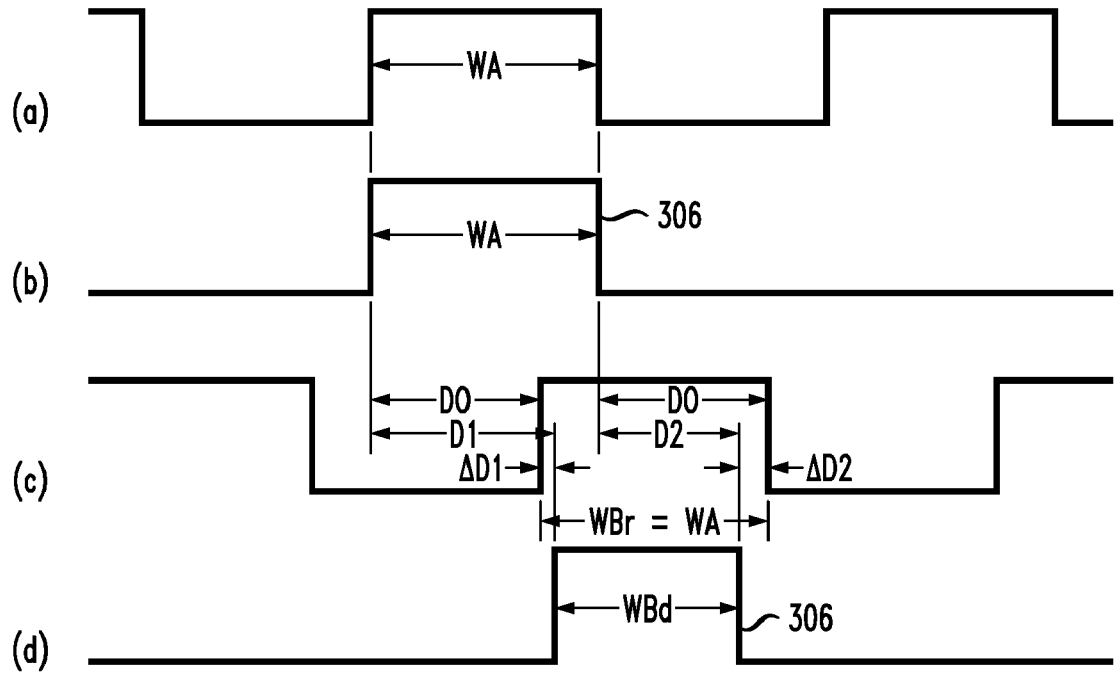
FIG. 3 is a diagram illustrating a steady state waveform at point A (a), a singled out pulse (b), a waveform at point Bd (c), and the pulse at point Br (d), according to an embodiment of the present invention.

Referring now to FIG. 3, a diagram illustrates waveforms at points A, Bd, and Br of FIG. 2, according to an embodiment of the present invention. In this example and in the subsequent discussion it is assumed that points of comparison are separated by an even number of inverting stages. Waveform (a) of FIG. 3 shows the steady state square waveform at point A, while waveform (b) of FIG. 3 shows a pulse 306 that is singled out by the pulse selector/synchronizer circuit and sent down the DLC. Waveform (c) of FIG. 3 shows the RO waveform at point Br which is displaced in time by D0=Mτ from that at A, where M is the number of gates between A and Br. Waveform (d) of FIG. 3 shows pulse 306 in the DLC as it arrives at point Bd. If there were no delay dependence on previous switching history, pulse 306 at point Bd would still be of width WA, still perfectly synchronized with the corresponding pulse of the RO waveform at point Br, and displaced in time from the waveform at point A by D0. With history effects present, pulse 306 at point Bd has a new width WBd which can be either greater or less than WA. Both the leading and trailing edges of pulse 306 can be displaced with respect to the corresponding edges of the RO waveform at point Br. The delay of the leading 1SW transition edge down the delay chain is D1 while the delay of the trailing 2SW transition edge is D2. The corresponding history values can be defined as follows:

$$H(1SW-SS)=(D1-D0)/D0 \quad (1)$$

$$H(2SW-SS)=(D2-D0)/D0 \quad (2)$$

$$H(1SW-2SW)=(D1-D2)/D0 \quad (3)$$

Figure 1:
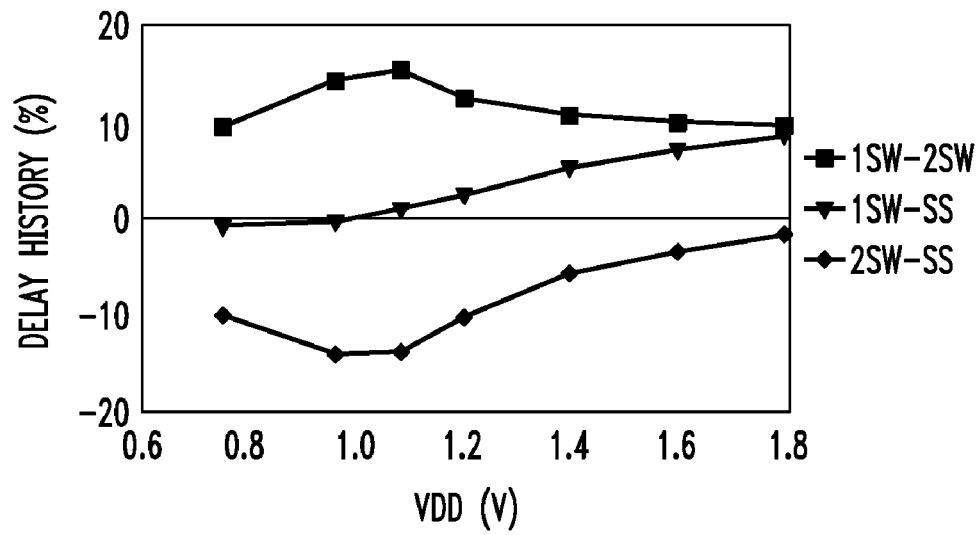
FIG. 1 is a diagram illustrating bench test data for an inverter chain experiment.

Pulse 306 in waveform (d) of FIG. 3 is for 1SW delay>2SW delay (WBd<WBr=WA), representative of typical 130 nm, 90 nm and 65 nm PD-SOI technologies at their nominal operating voltages, and is consistent with the data shown in FIG. 1. In addition the DLC waveform at Bd is straddled by the corresponding pulse of the RO waveform at Br. If instead the 1SW delay is <2SW delay, the pulse will widen as it travels down the DLC, and comparing the waveforms at Br and Bd results in WBd>WBr=WA. Initially, the described embodiment of the present invention is restricted to the WBd<WBr case as shown in FIG. 3. However, this case will later be generalized to include all other possibilities.

Figure 4:
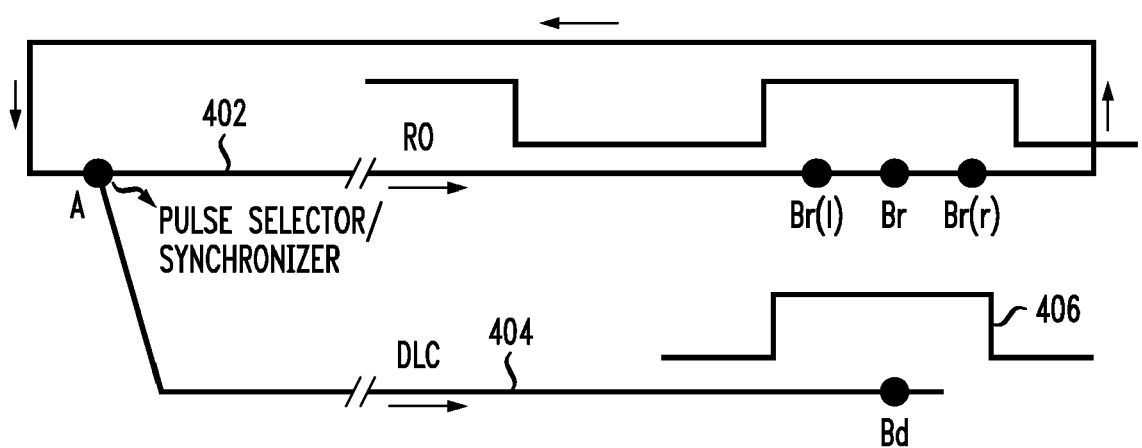
FIG. 4 is a diagram illustrating a RO and a DLC with superimposed waveforms of FIG. 3, according to an embodiment of the present invention.

Referring now to FIG. 4, a diagram illustrates a RO and a DLC with superimposed waveforms of FIG. 3, according to an embodiment of the present invention. A pulse 406 is shown at point Bd of a DLC 404, and a waveform is shown at point Br of RO 402. FIG. 4 also illustrates a point Br(l) to the left of Br and a second point Br(r) to the right of Br.

Figure 5:
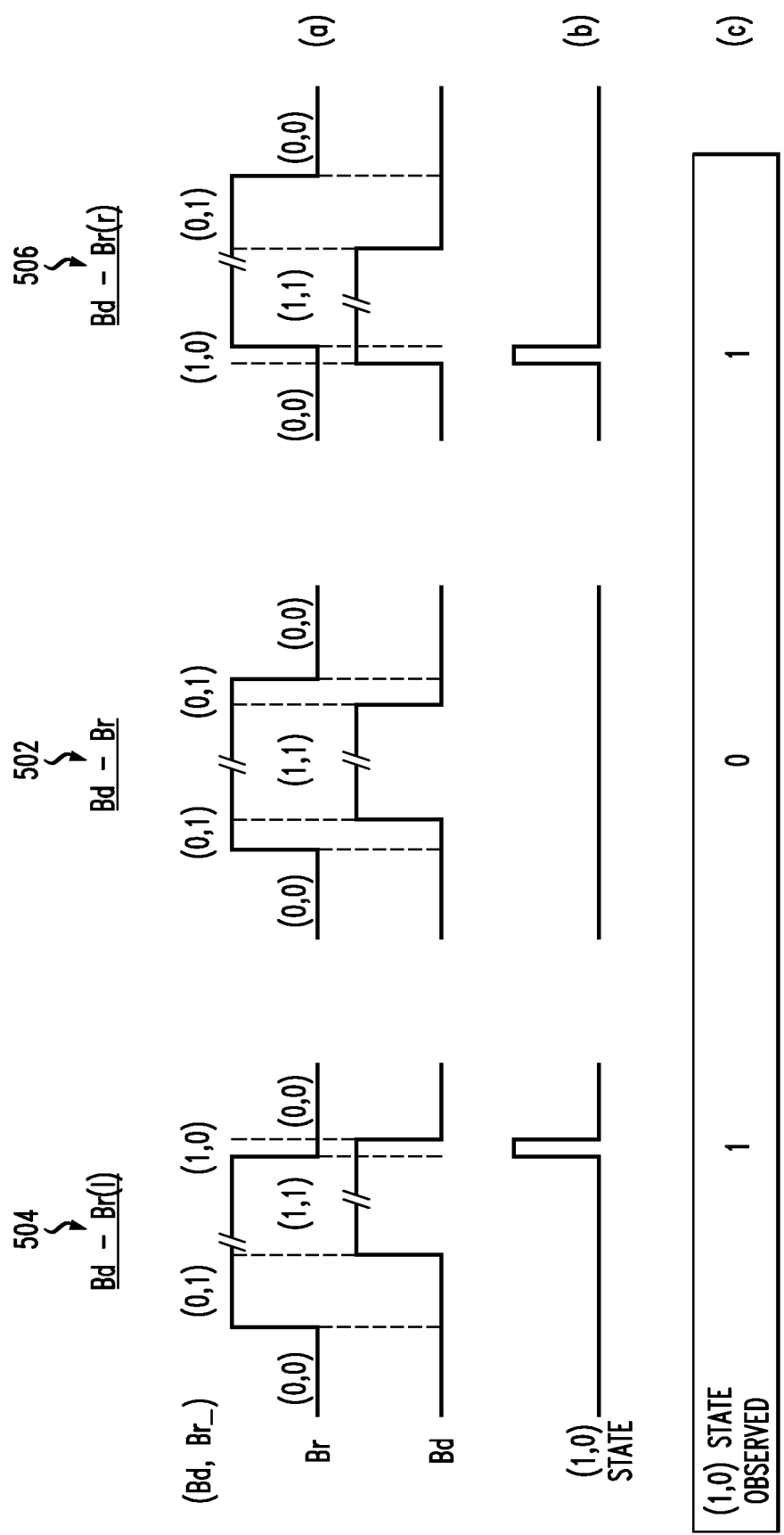
FIG. 5(a) is a diagram illustrating waveforms measured at Bd and Br, Bd and Br(l), and Bd and Br(r) of FIG. 4, according to an embodiment of the present invention.
FIG. 5(b) is a diagram illustrating the occurrence of the (1,0) state as a function of time for the three sets of waveforms, according to an embodiment of the present invention.
FIG. 5(c) is a diagram illustrating in a digital fashion whether the (1,0) state occurs at all or not, according to an embodiment of the present invention.

Referring now to FIG. 5(a), a diagram illustrates waveforms measured at Bd and Br, Bd and Br(l), and Bd and Br(r) of FIG. 4, with the same time base, according to an embodiment of the present invention. The middle set of waveforms 502 is previously described in FIGS. 3 and 4. In the first set of waveforms 504, the RO waveform is shifted to the left corresponding to its earlier arrival at Br(l). In the last set of waveforms 506, the RO waveform is shifted to the right corresponding to its later arrival at Br(r). Br(l) and Br(r) are sufficiently far from Br that the RO pulses at those points no longer straddle the DLC pulse at Bd. An overlap state is defined as (Bd, Br_) where Bd is a "1" or a "0" corresponding to the presence or absence of the pulse at Bd, and Br_ is a "1" or a "0" corresponding to the presence of absence of the pulse at Br, Br(l) or Br(r). The overlap states in the various regions are as indicated in the figure. In the middle set of waveforms 502, only three overlap states occur: (0,0), (0,1), and (1,1). In the first set of waveforms 504, involving the Br(l) point an additional state, (1,0), occurs for a length of time between the fall of the RO pulse at Br(l) and the fall of the DLC pulse at Bd. In the last set of waveforms 506, involving the Br(r) point the (1,0) state again occurs, this time for the length of time between the rise of the DLC pulse at Bd and the rise of the RO pulse at Br(r). FIG. 5(b) is a diagram that illustrates the occurrence of the (1,0) state as a function of time for the three sets of waveforms. FIG. 5(c) is a diagram that illustrates in a digital fashion whether the (1,0) state occurs at all or not.

If the number of gates between Br(l) and Br is varied, the width of the (1,0) state pulse in FIG. 5(b) will change. As the number of gates is reduced a critical separation will be reached at which the width of the (1,0) state pulse shrinks to 0 and the digital indication in FIG. 5(c) switches from a "1" to a "0". At this critical separation the time for a signal to travel along the ring from Br(l) to Br is exactly equal to the time delay between the DLC falling edge measured at Bd and the RO falling edge measured at Br. The corresponding analysis can be done for the rising edges to show a similar critical separation where the time for a signal to travel along the RO from Br to Br(r) is exactly equal to the time delay between the RO rising edge measured at Br and the DLC rising edge measured at Bd. In both these cases times can equally well expressed as the number of gates (or gate delays) between Br(l) and Br or Br and Br(r), respectively.

Figure 6:
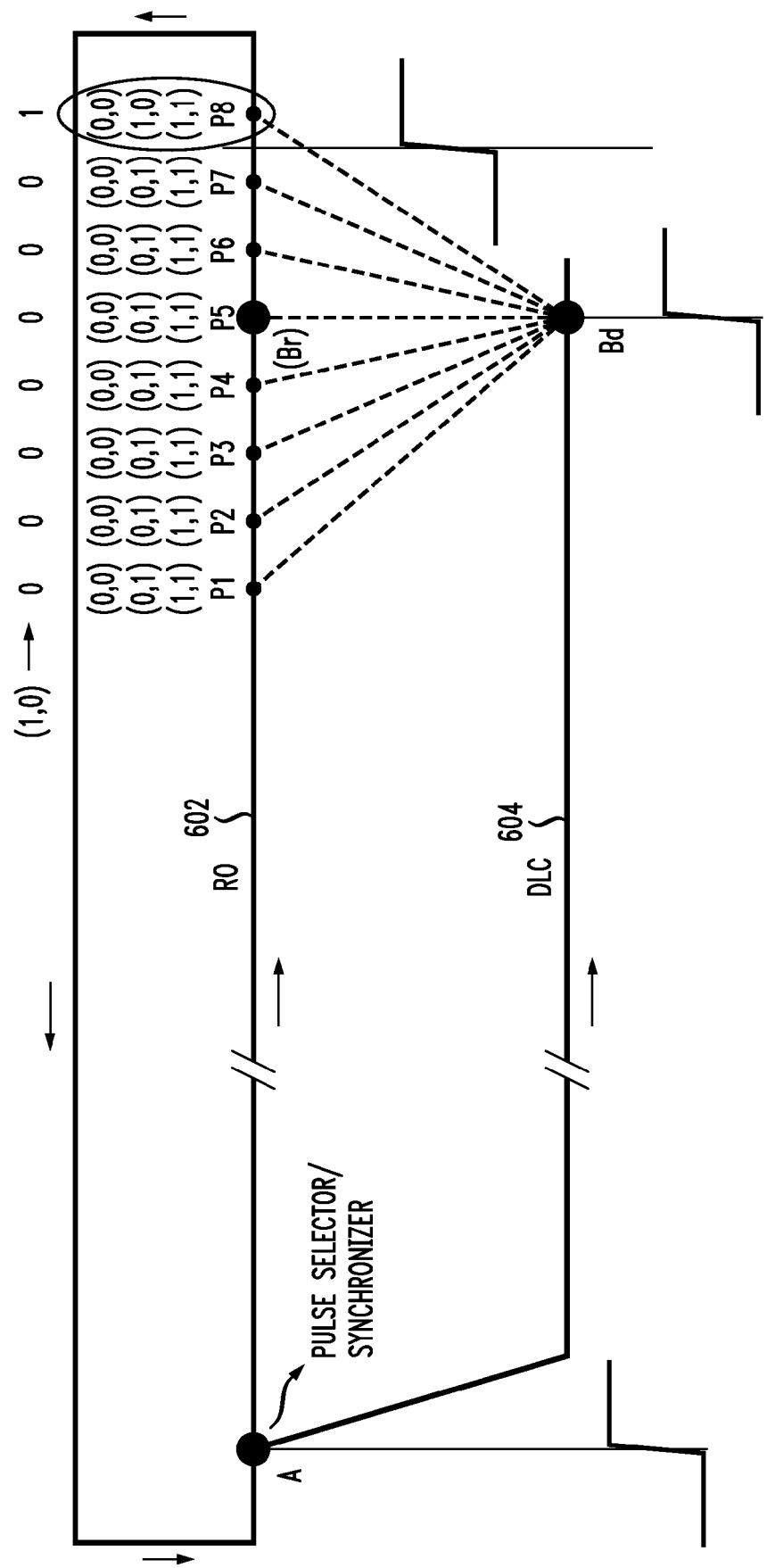
FIG. 6 is a diagram illustrating a RO and a DCL configuration with a 1SW rising edge of a selected pulse measurement, according to an embodiment of the present invention.

Referring now to FIG. 6, a diagram illustrates a 1SW rising edge of a selected pulse, according to an embodiment of the present invention. The rising edge arrives at the end of the DLC 604, point Bd, and simultaneously at a corresponding location to the right of point Br along the RO 602. Specific points Pj (j=1 to 8) are selected along the ring oscillator in the vicinity of Br.

For the case shown eight points are defined each separated in time from the next by an even number m of gate delays, mτ. Looking at points Bd and Br=P5 before the selected rising edge arrives at either, the state (Bd,P5) is (0,0). Just after the rising edge passes point P5, (Bd,P5)=(0,1), and just after the 1SW edge arrives at point Bd, (Bd,P5)=(1,1). This sequence of states is indicated immediately above P5. At Pj to the left of P5 the picture is similar with the (1,0) state never appearing. At Pj to the right of P5, the situation is similar at first, but a boundary is eventually crossed to the right of which the sequence becomes (0,0), (1,0), (1,1), with the (0,1) state now not occurring. In FIG. 6 this boundary lies between P7 and P8. The occurrence of the (1,0) state at the Pj points is represented by the string of "0"s and "1"s across the top right section of the FIG. 6. It is evident that H(1SW−SS)>D(P7−P5)/D0=2 mτ/Mτ=2 m/M and H(1SW−SS)<d(P8−P5)/D0=3 m/M. Note that this is a self calibrated result in that knowledge of the actual delays is not required, see, for example, Ketchen et al., "High Speed Test Structures for In-line Process Monitoring and Model Calibration," *Proc.* 2005 *IEEE International Conference on Microelectronic Test Structures* , pp. 33-38 , April, 2005.

Figure 7:
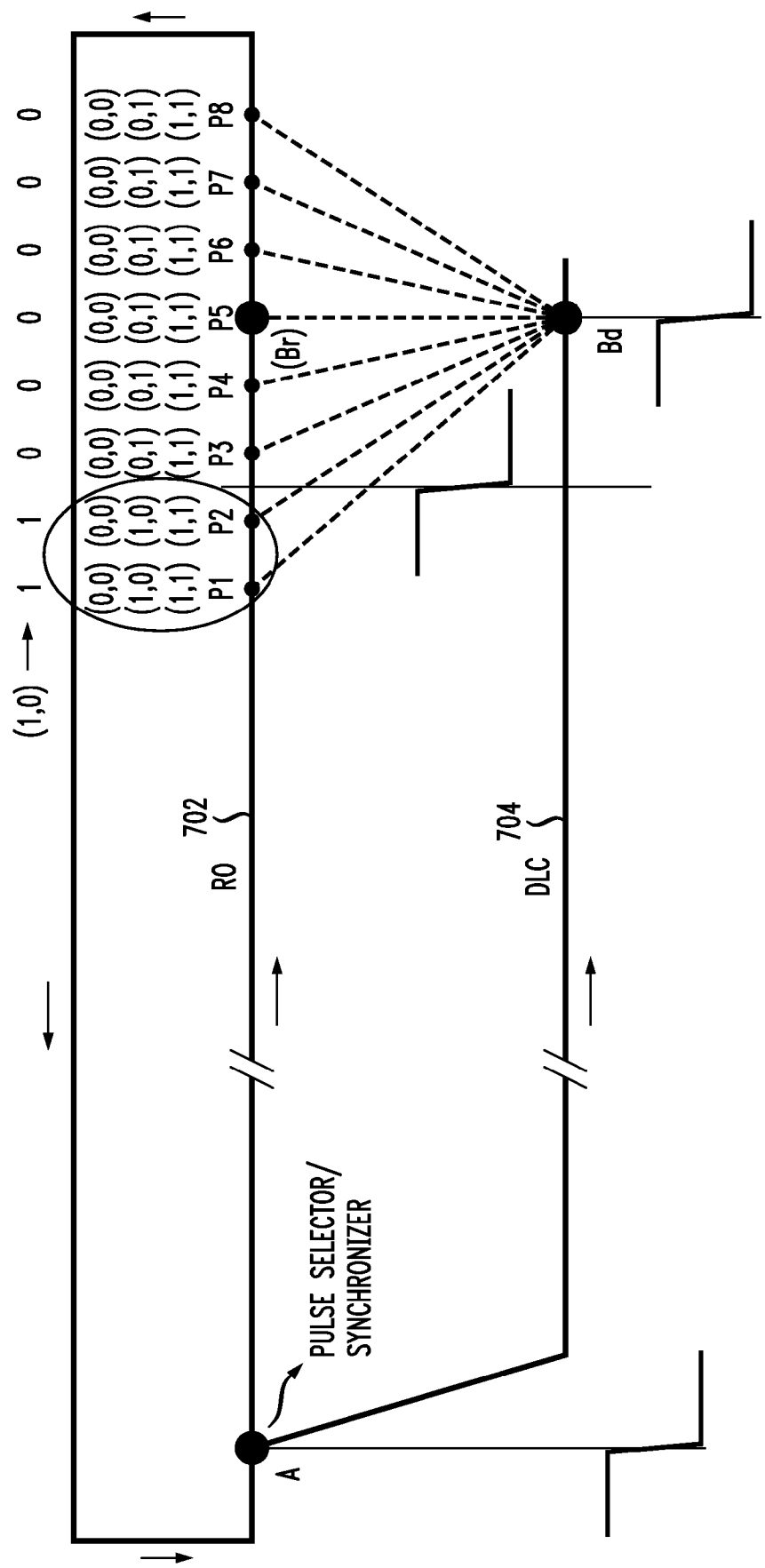
FIG. 7 is a diagram illustrating a RO and a DCL configuration with a 2SW falling edge measurement that completes the selected pulse, according to an embodiment of the present invention.

Referring now to FIG. 7, a diagram illustrates a 2SW falling edge that completes the selected pulse, according to an embodiment of the present invention. The falling edge leaves point A and arrives at Bd of DLC 704 and simultaneously at a corresponding location to the left of point Br along the RO 702. Looking at points Bd and Br=P5 before the selected falling edge arrives at either, the state of (Bd,P5) is (1,1). Just after the 2SW edge arrives at point Bd, (Bd,P5)=(0,1), and just after falling edge passes point P5, (B,P5)=(0,0). At Pj to the right of P5 the picture is similar with the state (1,0) never appearing. At Pj to the left of P5, the situation is similar at first, but a boundary is eventually crossed to the left of which the sequence becomes (1,1), (1,0), (0,0), with the (0,1) state now not occurring. In FIG. 7 this boundary lies between P2 and P3. The occurrence of the (1,0) state at the various Pj is again indicated as a string of "1"s and "0"s. From this picture it is evident that H(2SW−SS)>d(P2−P5)/D0=−3 m/M and H(2SW−SS)<d(P3−P5)/D0=−2 m/M.

Figure 8:
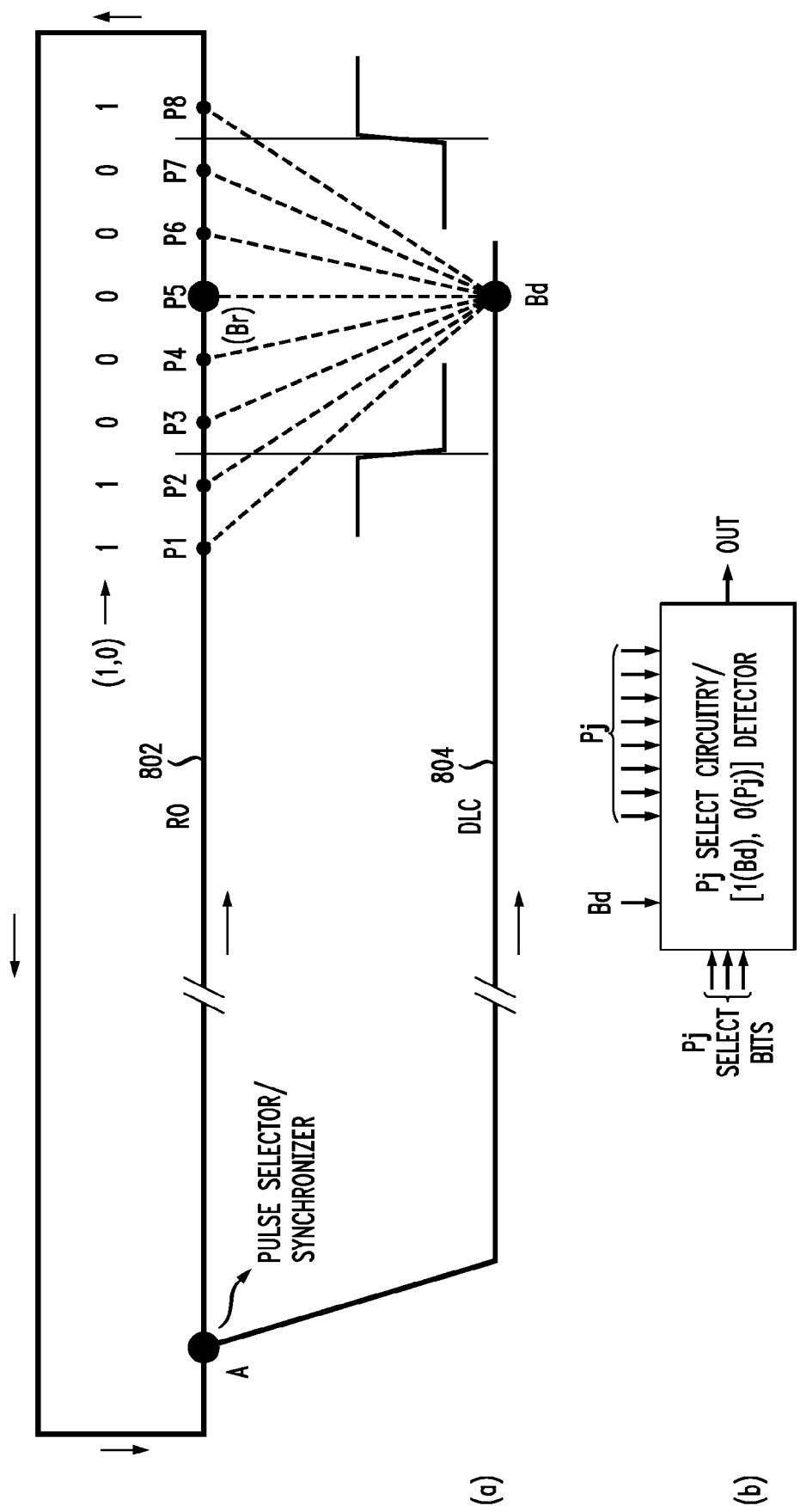
FIG. 8(a) is a diagram illustrating a summary of the contents of FIGS. 6 and 7, according to an embodiment of the present invention.
FIG. 8(b) is a diagram illustrating conceptually a circuit that connects to points Bd and Pj and is used to determine the points Pj for which the state (1,0) appears, according to an embodiment of the present invention.

Referring now to FIG. 8(a), a diagram illustrates a summary of the contents of FIGS. 6 and 7, according to an embodiment of the present invention. Boundaries described above are shown between P2 and P3 along RO 802 for the falling edge of the pulse at Bd on DLC 804, and between P7 and P8 for the rising edge. FIG. 8(*a*) shows that the 1SW–SS and 2SW–SS histories can be self consistently represented in terms of regions where the state of (Bd,Pj) can be (1,0) and can not be (1,0), as represented by the string of "1"s and "0"s above the various Pj. Since it is known that P5=Br, the 1SW–SS and 2SW–SS history values in units of m/M can be read directly from this string.

Referring now to FIG. 8(*b*), a diagram illustrates conceptually a circuit that connects to points Bd and Pj and is used to determine the points Pj for which the state (1,0) appears, according to an embodiment of the present invention. For example, with one version of this circuit eight separate but nominally identical pulse launch events are initiated, for each of which a decoder is set to select a particular Pj. For each event the (1,0) state is either detected "1" or not "0". The outcome is a set of eight "1"s and "0"s as indicated in FIG. 8, depicting H(1SW–SS) and H(2SW–SS) with a resolution of m/M.

Up to this point it has been assumed that the waveforms at Br and Bd are as depicted as waveforms (c) and (d) of FIG. 3, respectively. There 1SW delay>2SW delay (WBd<WBr=WA) and the DLC waveform at Bd is straddled by the corresponding pulse of the RO waveform at Br. Revisiting the discussion of FIGS. 6 and 7 it is now clear that the picture remains essentially the same if these constraints on the waveforms are relaxed. In particular the 1SW rising edge can reach point Bd before or after the corresponding SS rising edge reaches point Br and the 2SW falling edge can reach point Bd before or after the corresponding SS falling edge reaches point Br. In all cases the transition from "1" to "0" in the string of "1"s and "0"s representing the occurrence of the (1,0) state represents the respective history value, whether it occurs to the right or left of Br (=P5 in this case). The combination picture shown in FIG. 8(*a*) also continues to hold, but only if the 1SW delay remains greater than the 2SW delay. If the 2SW delay is greater than the 1SW delay the string of "1"s and "0"s representing the occurrence of the (1,0) state becomes a string of only "1"s, and the history information is lost. In practice it is desirable to have a circuit that can be used to do the composite measurement initially, since typically 1SW delay is longer than 2SW delay, but which also allows subsequent measurements of each edge individually if the initial measurement gives a string of only "1"s.

According to an embodiment of the present invention, circuits can be combined with a ring oscillator frequency determination to implement this history and delay measurement capability with all the features discussed above. One such circuit is a pulse selector/synchronizer circuit for launching the necessary pulse down the DLC synchronously with the signal circulating in the RO. Another such circuit is a circuit scheme for measuring the relative delay/stage of signals traveling around a ring oscillator in steady state with respect to signals synchronously launched down a previously quiescent DLC of similar gates.

Figure 9:
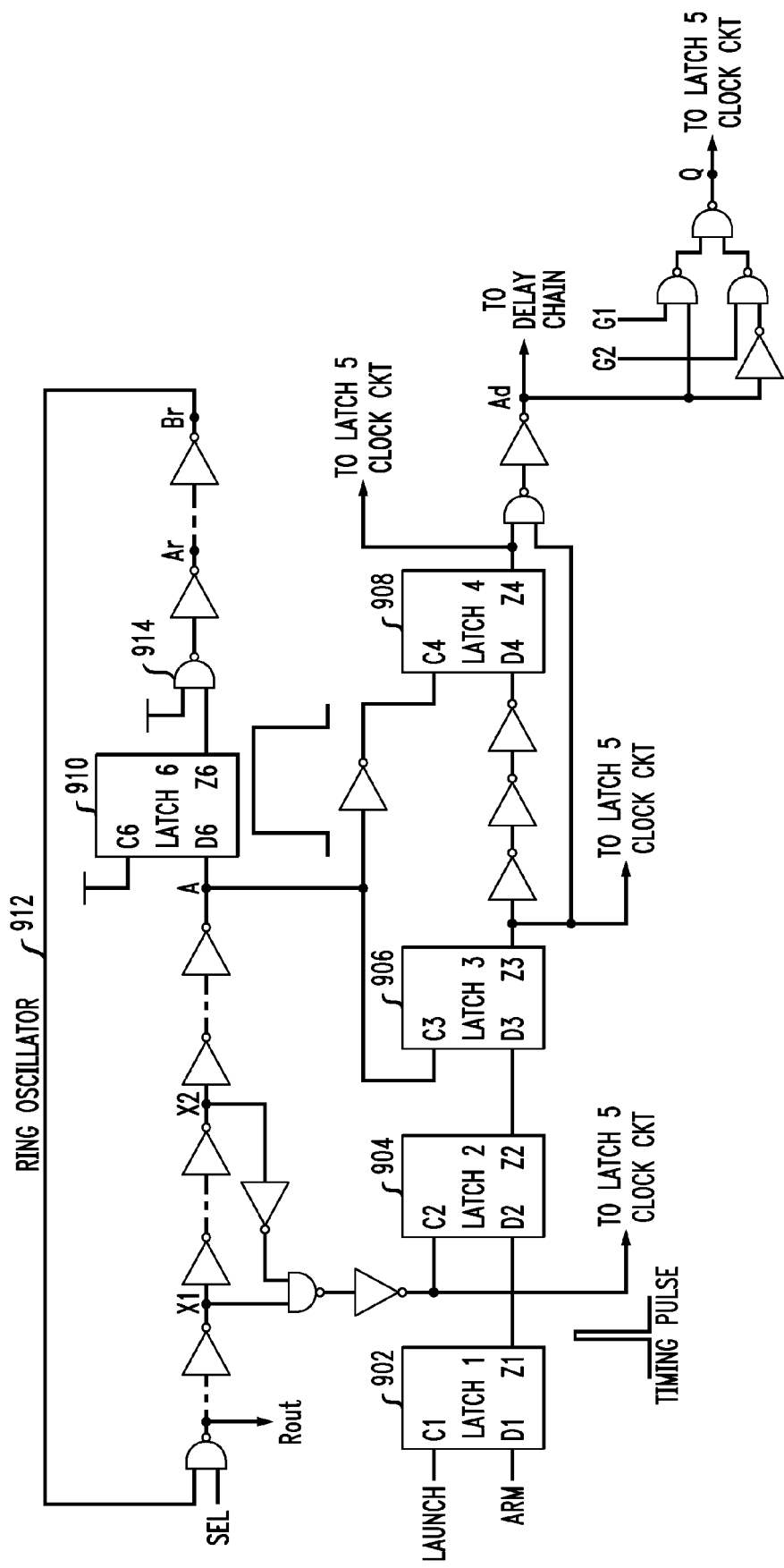
FIG. 9 is a diagram illustrating an implementation of the pulse selector/synchronizer circuit, according to an embodiment of the present invention.

Referring now to FIG. 9, a diagram illustrates an implementation of the pulse selector/synchronizer circuit, according to an embodiment of the present invention. This circuit utilizes four active latches 902, 904, 906, 908, a load latch 910, various combinatorial logic gates, and a RO 912 to accomplish the desired task. The Clock, Data input and Data output ports of each latch are designated as C#, D#, and Z#, respectively where # is the latch number. There are three dc inputs, Sel, Arm and Launch, for generating the pulse. Inputs G1 and G2 are DC inputs used in conjunction with the detection circuit that will be discussed later. The transition times and shapes of all the externally applied input signals are not important. The voltage output at node ROUT is used for measuring the RO frequency with an external frequency counter after dividing it by, for example, 256. RO 912 comprises n gates, preferably where n>1000, and a NAND2 gate 914 to enable the oscillations. Latch6 910 and a NAND2 gate 914 are inserted to the right of node A in RO 912 to keep the delay path composition in RO 912 from A to Br as close as possible to that from A to Bd in the DLC.

Figure 10:
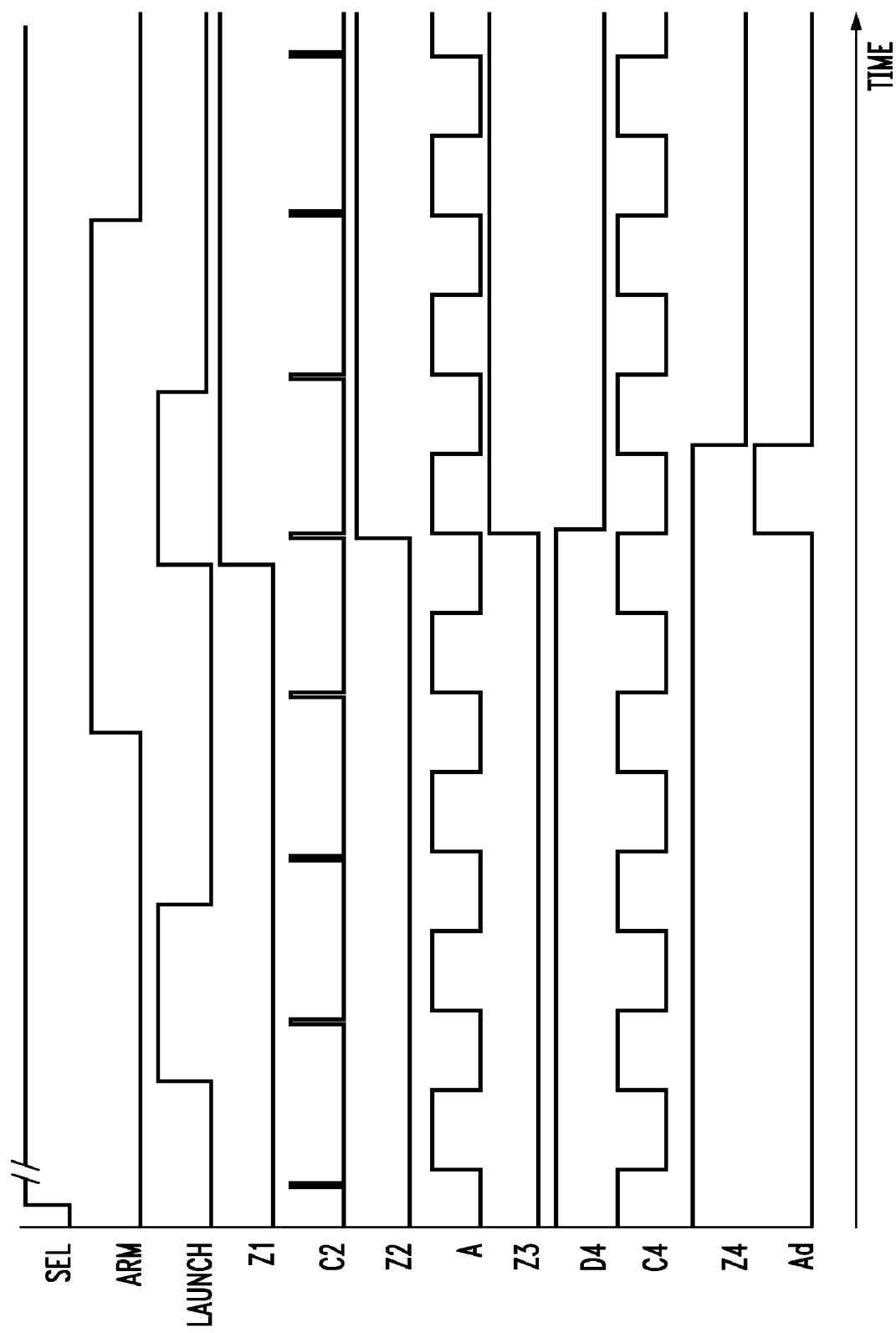
FIG. 10 is a timing diagram illustrating the voltage levels at different nodes in the circuit of FIG. 9 during a pulse generation event, according to an embodiment of the present invention.

Referring now to FIG. 10, a timing diagram illustrates the voltage levels at different nodes in the circuit of FIG. 9 during a pulse generation event, according to an embodiment of the present invention. When the Sel input is set to "1" the RO is enabled and a steady state condition is achieved after time on the order of 100 µs-1 ms. The square waveform of the RO as seen at A is shown in trace A of FIG. 10. A timing pulse generated across nodes X1 and X2 from the signal circulating in the RO, shown as trace C2 in FIG. 10, drives the clock input C2 of Latch 2. The width of this pulse is equal to the gate delay of the even number of gates between X1 and X2 is designed to be ~100 ps, much smaller than the period of the RO, such as, for example, 10-20 ns. With the RO in steady state input Launch is set to "1" with input Arm at "0" and the system is allowed to run in this configuration for a time equivalent to many cycles of the RO. This operation sets the latch outputs Z1, Z2 and Z3 to "0" and Z4 to "1". The inputs to Latch1 establish a "0" at Z1 and at D2. The next timing pulse at C2 enables the "0" at D2 to be transferred to Z2 and on to D3. As the rising edge that generated the C2 timing pulse moves further down the RO to point A it applies a "1" to C3 and through an inverter a "0" to C4. The "0" at D3 is passed to Z3, placing a "1" at Z4 and a "0" at the lower input of the NAND2 following Latch4. One half RO cycle later a falling edge passes points X1, X2, and A. It has no affect as it passes points X1 and X2, however as it passes point A a "1" is placed on the C4 which enables transfer of the "1" at D4 to Z4 on to the upper input of the following NAND2. As the RO continues to oscillate there are no further changes at the data input and data output ports of the four latches. Next the Launch input is set to "0" and then the Arm input is set to "1", completing the preset of the circuit for a pulse launch.

To launch a synchronous pulse down the delay chain, a "1" is next applied to the Launch input, the second pulse in the Launch trace of FIG. 10. At some point in the turn on of this pulse, which is completely arbitrary with respect to the signal that is circulating in the RO, the clock of Latch1 turns on and the "1" at D1 passes on to Z1 and to D2. The next C2 clock pulse enables the "1" at D2 to pass to Z2 and on to D3. When the rising edge that generated the C2 pulse arrives at point A, it sets C3="1" and C4="0". The "1" at D3 then passes to Z3 and on to the lower input of the NAND2 that follows Latch4, as well as establishing a "0" at D4 (after C4 was set to "0"). The NAND2, which was waiting with a "1" on its other input, immediately switches, passing the 1SW edge down the DLC, with a rising edge at point Ad being lined up with the corresponding rising edge point Ar. One half RO cycle later the next falling edge passes points X1, X2, and A. It has no affect as it passes points X1 and X2; however, as it passes point A, a "1" is placed on C4 which enables transfer of the "0" waiting at D4 to Z4 and on to the upper input of the following NAND2. This pulls up the NAND2 and passes the 2SW transition down the DLC, with a falling edge at Ad being lined up with the corresponding falling edge at Ar. As the RO continues to oscillate there are no further changes at the data input and data output ports of the four latches until further changes are made to external input signals. The net results of these events is to send a single pulse of initial width WA down the DLC as indicated in the trace labeled Ad of FIG. 10, which, at the beginning, is perfectly synchronized with the signal in the RO. Note that with Latch6 and the NAND2 in the RO the DLC pulse and the corresponding RO pulse can be viewed as coincident at point A. Also note that if the "1" from Z1 happens to arrive at D2 at the same time that a C2 clock pulse is being applied, the "1" will continue on to Z2 if C2 remains at "1" long enough, and the DLC pulse will be subsequently generated. If the C2 is not on long enough then the "1" will not pass through Latch2 until one RO cycle time later. Either way one and only one pulse will be launched down the DLC.

Figure 11:
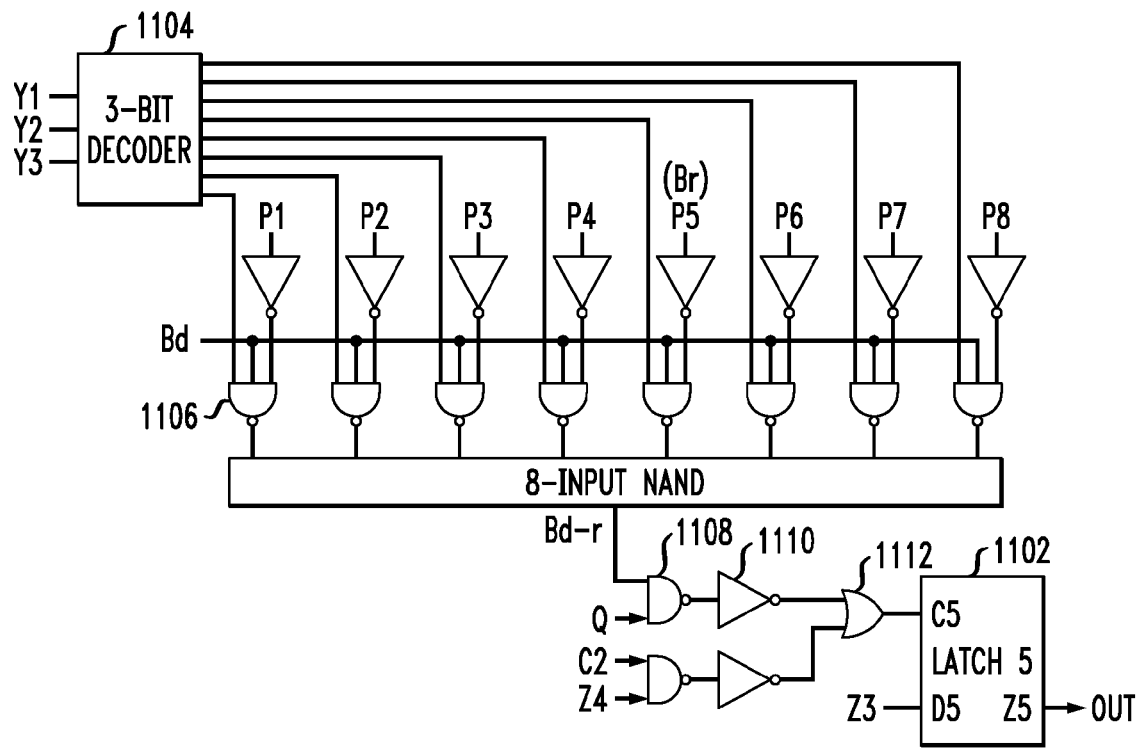
FIG. 11 is a diagram illustrating a (1,0) detector circuit of FIG. 8(b), according to an embodiment of the present invention.

Referring now to FIG. 11, a diagram illustrates a (1,0) detector circuit of FIG. 8(b), according to an embodiment of the present invention. Signals from the pulse selector/synchronizer circuit are used to control Latch5 1102 in the (1,0) detector as indicated in FIGS. 9 and 11.

Figure 12:
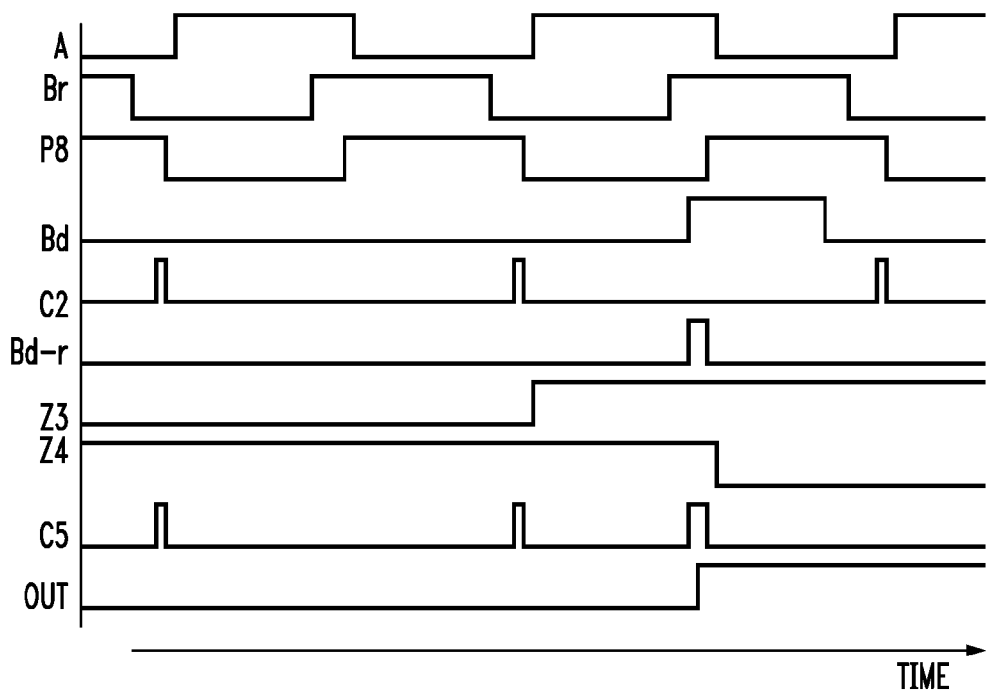
FIG. 12 is a timing diagram illustrating the voltage levels at different nodes in the circuit of FIG. 11 during a measurement event, according to an embodiment of the present invention.

Referring now to FIG. 12, a timing diagram illustrates the voltage levels at different nodes in the circuit of FIG. 11 during a measurement event, according to an embodiment of the present invention. During the latch reset cycle when Arm="0" and Launch="1", Z3 is at "0", Z4 is at "1", and C2 is periodically pulsing. The C2 pulses are being applied to C5, which enables the "0" at D5 to be passed to Z5. Soon after the Latch2 clock input pulse that initiates the DLC pulse generation process, Z3 changes to a "1" which is applied to D5, readying Latch5 1102 to detect the next pulse at C5.

Referring back to FIG. 11, for the case of eight Pj points a three-bit (Y1, Y2, Y3) decoder 1104 is used to select one of the eight points by placing a "1" on the corresponding NAND3 input. All the NAND3s 1106 have "1"s at their outputs, with the possible exception of the selected NAND3 which will generate a short complementary pulse with a width of approximately the time duration for which the (1,0) state exists per the discussion related to FIGS. 6-8. If such a pulse is generated it is in turn applied to the input of the 8-input NAND, the other seven inputs being at "1". This causes a short positive pulse to be generated at node Bd-r, also having a width of approximately the time duration for which the (1,0) state exists. Provided input Q="1", this pulse continues on through NAND2 1108, inverter 1110, and OR gate 1112 to the clock port C5 of Latch5 1102, which is waiting with a "1" preloaded at its data port D5. The "1" is passed through to Z5 where it is held for observation at the OUT terminal at a later time. Note that the 2SW edge is launched down the delay chain in response to a "0" appearing at Z4. It follows that none of the subsequent C2 pulses will be passed on to C5 until another reset cycle is initiated, which will be after Z5 is observed to be either a "0" or a "1".

The input Q is generated as shown in FIG. 9 from external DC inputs G1 and G2 and from the node voltage Ad. If G1="1" and G2="0", Q will be at "1" only for rising edge measurement events. If G1="0" and G2="1", Q will be at "1" only for falling edge measurement events. If G1="1" and G2="1", Q will be at "1" for both rising and falling edge measurement events. These three situations correspond to the three cases described in FIGS. 6-8.

Figures 13, 14:
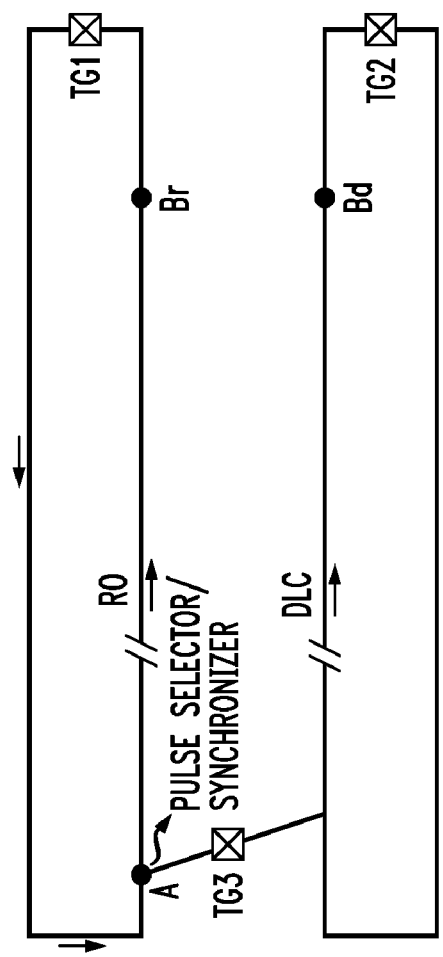
FIG. 13 is a table of the bit pattern used to partially exercise and read out the test structure, according to an embodiment of the present invention.
FIG. 14 is a diagram illustrating a RO and a DCL configuration capable of verifying that the average gate delays in the RO and the DLC are identical, according to an embodiment of the present invention.

The above process for generating a pulse on the DLC, detecting the presence or absence of the (1,0) state associated with the selected Pj point, and then resetting the circuitry is repeated for each of the Pj points sequentially along the RO. The resulting read out pattern of "1" and "0" values can then be directly interpreted to give the history values per the discussion of FIGS. 6-8. In addition, as indicated in FIG. 7, the output from the RO is directed through a frequency divider and can be directly read out at a low frequency (~MHz) providing an absolute time calibration of SS, 1SW, and 2SW delays. FIG. 13, shows a table of the bit pattern used to partially exercise and read out the test structure.

The above analysis assumes that the average gate delays in the RO and the DLC are identical and it is important to verify that this assumption is correct. This is accomplished by adding gates to the DLC and configuring it as a ring oscillator that is nominally identical to the original RO. Any difference in the gate delays in the RO and the DLC induced by process bias can be measured by operating the DLC in this ring oscillator mode. This may be implemented with the scheme shown in FIG. 14. Three transmission gate switches TG1, TG2 and TG3 are placed as indicated in this figure. For measuring the frequency of the DLC 1404, the switch TG2 is closed and TG1 on RO 1402 and TG3 are open. For the normal operation, TG1 and TG3 are closed and TG2 is open.

Figure 15:
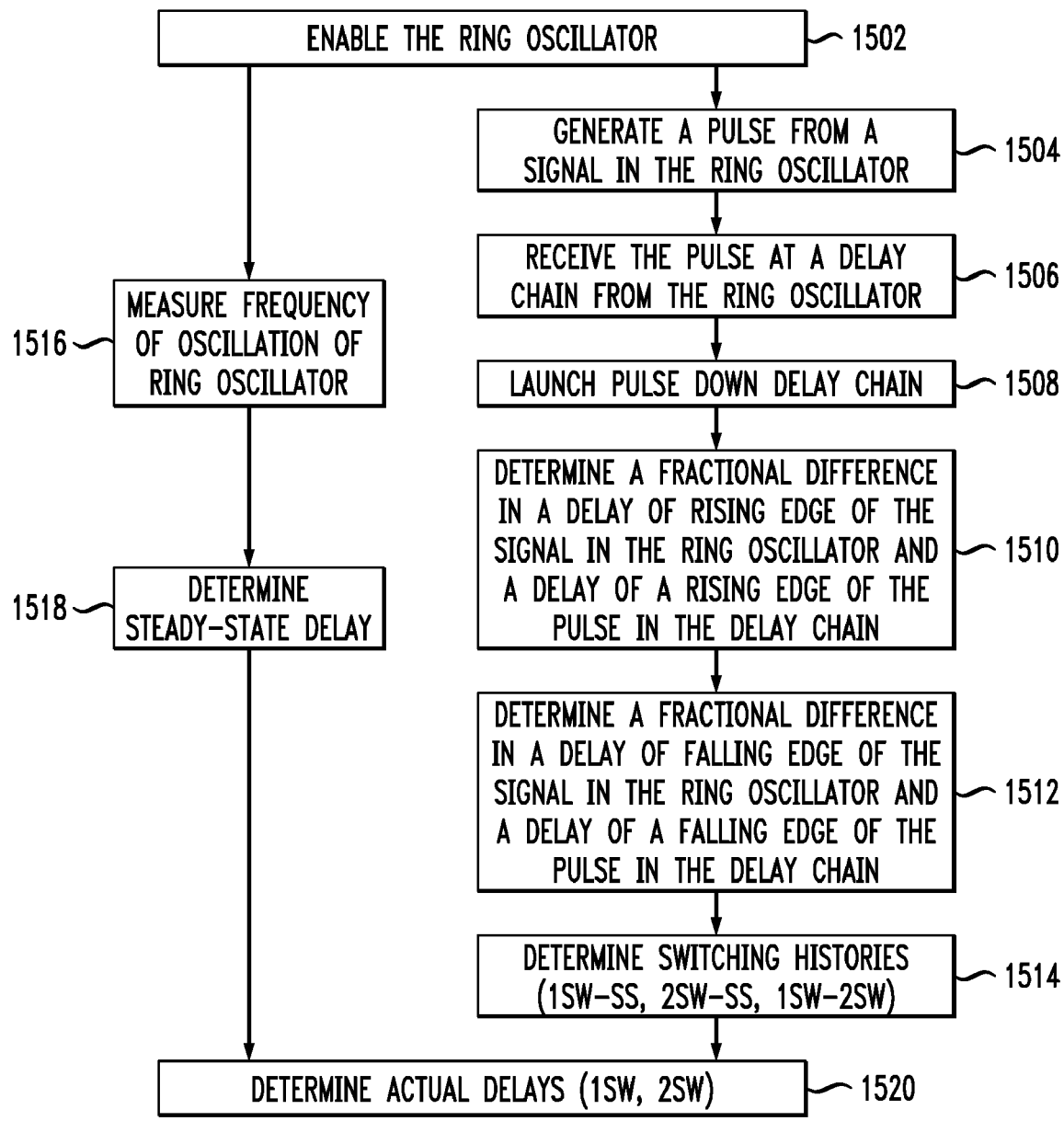
FIG. 15 is a flow diagram illustrating an inline measurement methodology for switching delay history effects, according to an embodiment of the present invention.

Referring now to FIG. 15, a flow diagram illustrates an inline measurement methodology for switching delay history effects, according to an embodiment of the present invention. The methodology begins in block 1502, a ring oscillator is enabled. In block 1504, a pulse is generated from a signal in the ring oscillator. The pulse is substantially synchronized with the signal. In block 1506, the pulse is received at a delay chain from the ring oscillator. In block 1508, the pulse is launched down the delay chain having substantially identical gates as the ring oscillator to a defined point on the ring oscillator corresponding to a far end of the delay chain. In block 1510, a fractional difference in a delay of rising edge of the signal in the ring oscillator and a delay of a rising edge of the pulse in the delay chain is determined. In block 1512, a fractional difference in a delay of a falling edge of the signal in the ring oscillator and a delay of a falling edge of the pulse in the delay chain is determined. In block 1514, 1SW–SS, 2SW–SS, and 1SW–2SW switching histories are determined.

From block 1502, the frequency of oscillation of the ring oscillator is measured in block 1516. In block 1518, a steady-state (SS) delay is determined. In block 1502, actual delays, 1SW and 2SW, are determined from the switching histories and the steady-state delay, terminating the methodology.

Although illustrative embodiments of the present invention have been described herein with reference to the accompanying drawings, it is to be understood that the invention is not limited to those precise embodiments, and that various other changes and modifications may be made by one skilled in the art without departing from the scope or spirit of the invention.

What is claimed is:

1. A method of inline measurement of switching delay history effects in an integrated circuit device comprising the steps of:

launching a pulse down a delay chain, wherein the pulse is substantially synchronized with a signal of a ring oscillator, and the delay chain and the ring oscillator comprise substantially identical gates to a defined point on the ring oscillator corresponding to a far end of the delay chain;

measuring at least one difference between a number of gates traversed by an edge of the signal in the ring oscillator and a number of gates traversed by a corresponding edge of the pulse in the delay chain when the pulse reaches the far end of the delay chain; and determining one or more switching histories in the integrated circuit device in accordance with the at least one measured difference in the number of gates traversed by an edge of the signal and a corresponding edge of the pulse;

wherein the step of measuring at least one difference comprises the step of determining a fractional difference in a delay of a rising edge of the signal in the ring oscillator and a delay of a rising edge of the pulse in the delay chain; and wherein the method is operative to perform the step of determining one or more switching histories when a first switch delay is greater than a second switch delay, and when the second switch delay is greater than the first switch delay.

2. The method of claim 1, wherein, in the step of launching a pulse, the pulse comprises a width substantially equal to half a period of oscillation of the ring oscillator.

3. The method of claim 1, wherein the step of launching a pulse comprises the step of:

generating a pulse from the signal in the ring oscillator, wherein the pulses is substantially synchronized with the signal; and receiving the pulse at the delay chain from the ring oscillator.

4. The method of claim 1, wherein circuit composition and nominal delay are substantially equal in the delay chain and to the defined point of the ring oscillator.

5. The method of claim 1, wherein the step of determining a fractional difference in delay comprises the steps of:

determining a rising point on the ring oscillator where a position of the signal ceases overlap of the rising edge of the pulse at the far end of the delay chain;

measuring a fractional difference in a number of gates between the rising point on the ring oscillator and the defined point on the ring oscillator, corresponding to a first switching history in the integrated circuit device.

6. The method of claim 5, further comprising the step of determining one or more delays in the integrated circuit device in accordance with the fractional difference in delay and a frequency of oscillation of the ring oscillator.

7. The method of claim 6, further comprising the steps of:
determining a frequency of oscillation of the ring oscillator;
determining a steady state delay from the frequency of oscillation of the ring oscillator; and
determining a first switch delay in accordance with the steady state delay and the first switching history in the integrated circuit device.

8. The method of claim 1, wherein the launching, measuring and determining steps require only substantially direct current inputs.

9. A method of inline measurement of switching delay history effects in an integrated circuit device comprising the steps of:

launching a pulse down a delay chain, wherein the pulse is substantially synchronized with a signal of a ring oscillator, and the delay chain and the ring oscillator comprise substantially identical gates to a defined point on the ring oscillator corresponding to a far end of the delay chain;

measuring at least one difference between a number of gates traversed by an edge of the signal in the ring oscillator and a number of gates traversed by a corresponding edge of the pulse in the delay chain when the pulse reaches the far end of the delay chain; and determining one or more switching histories in the integrated circuit device in accordance with the at least one measured difference in the number of gates traversed by an edge of the signal and a corresponding edge of the pulse;

wherein the step of measuring at least one difference comprises the step of determining a fractional difference in delay of a falling edge of the signal in the ring oscillator and a delay of a falling edge of the pulse in the delay chain; and wherein the method is operative to perform the step of determining one or more switching histories when a first switch delay is greater than a second switch delay, and when the second switch delay is greater than the first switch delay.

10. The method of claim 9, wherein the step of determining a fractional difference in delay further comprises the steps of:

determining a falling point on the ring oscillator where a position of the signal ceases overlap of the falling edge of the pulse at the far end of the delay chain;

measuring a fractional difference in a number of gates between the falling point on the ring oscillator and the defined point on the ring oscillator, wherein the difference corresponds to a second switching history in the integrated circuit device.

11. The method of claim 10, further comprising the step of determining one or more delays in the integrated circuit device in accordance with the fractional difference in delay and a frequency of oscillation of the ring oscillator.

12. The method of claim 11, further comprising the steps of:

determining the frequency of oscillation of the ring oscillator;
determining a steady state delay from the frequency of oscillation of the ring oscillator; and
determining a second switch delay in accordance with the steady state delay and the second switching history.

13. A method of inline measurement of switching delay history effects in an integrated circuit device comprising the steps of:

launching a pulse down a delay chain, wherein the pulse is substantially synchronized with a signal of a ring oscillator, and the delay chain and the ring oscillator comprise substantially identical gates to a defined point on the ring oscillator corresponding to a far end of the delay chain;

measuring at least one difference between a number of gates traversed by an edge of the signal in the ring oscillator and a number of gates traversed by a corresponding edge of the pulse in the delay chain when the pulse reaches the far end of the delay chain; and determining at least second switching history in the integrated circuit device in accordance with the at least one measured difference in the number of gates traversed by an edge of the signal and a corresponding edge of the pulse at least when a second switch delay in the integrated circuit is shorter than a first switch delay in the integrated circuit.

* * * * *